United States Patent [19]

Saito et al.

[11] 4,020,353
[45] Apr. 26, 1977

[54] SAMPLE ANALYSIS APPARATUS USING ELECTRON BEAM IRRADIATION

[75] Inventors: Syobu Saito, Mito; Yoshio Sakitani, Katsuta, both of Japan

[73] Assignee: Hitachi, Ltd., Japan

[22] Filed: Sept. 3, 1975

[21] Appl. No.: 609,943

[30] Foreign Application Priority Data

Sept. 6, 1974 Japan ............................. 49-102029

[52] U.S. Cl. ................................................ 250/441
[51] Int. Cl.² ........................................ H01J 37/06
[58] Field of Search ............ 250/310, 311, 441, 457

[56] References Cited

UNITED STATES PATENTS

| 2,292,087 | 8/1942 | Ramo | 250/441 |
| 2,602,899 | 7/1952 | Page | 250/441 |
| 2,892,087 | 6/1959 | Day | 250/457 |
| 3,870,882 | 3/1975 | Larson | 250/413 |

Primary Examiner—Alfred E. Smith
Assistant Examiner—B. C. Anderson
Attorney, Agent, or Firm—Craig & Antonelli

[57] ABSTRACT

In a sample analysis apparatus, a sample to be analyzed is irradiated by the electron beam from an electron gun, and the information obtained from the sample and characteristic of the sample is detected for the analysis of the sample. The electron gun and the sample are placed respectively in an electron gun chamber and in a sample chamber. An intermediate chamber is located between the electron gun chamber and the sample chamber. That portion of the sample chamber which contains the sample is protuberant into the intermediate chamber. The intermediate chamber is evacuated to a degree of vacuum higher than the sample chamber but lower than the electron gun chamber.

16 Claims, 4 Drawing Figures

SAMPLE ANALYSIS APPARATUS USING ELECTRON BEAM IRRADIATION

BACKGROUND OF THE INVENTION

The present invention relates to a sample analysis apparatus using electron beam irradiation, and more particularly to such an apparatus adapted for the case where there is a need that an electron gun chamber containing an electron gun to emit an electron beam must be evacuated to a higher degree of vacuum than a sample chamber containing a sample irradiated by the electron beam.

Examples of sample analysis apparatus using electron beam irradiation are a scanning electron microscope, an electron-probe X-ray microanalyser, etc. The principle of operation of these apparatuses is such that a sample to be analysed is irradiated by an electron beam whereby the information obtained from the sample and characteristic of the sample is detected. Here, the information obtained is in the form of transmitted electrons, reflected electrons, secondary electrons, absorbed electrons, Auger electrons, X-rays, cathode luminescence, etc. The means for detecting such information is one for converting the information into electric signals.

It is well known that when an electric field of about $10^7$ V/cm is concentrated on the pointed end of a metal rod, having a radius of less than 1000 A, electrons are emitted from the pointed end of the cold metal rod. The current due to this field emission increases with the increase in the intensity of the electric field concentrated on the pointed end. The electron current density due to the field emission is $10^3$ times higher than the corresponding electron current density due to thermionic emission. For this reason, the field emission source is called a high intensity electron generating source. Moreover, a practical source of electrons in thermionic emission has a diameter of several microns to several tens of microns while the diameter of a practical electron source in field emission is smaller than 100 A.

The most difficult problem that has prevented the electron gun of field emission type from being used in a sample analysis apparatus using electron beam irradiation, notwithstanding the above mentioned merits, is a difficulty in obtaining a high degree of vacuum in the order of $10^{-10}$ Torr which is necessary for generating a stable field emission current. With the recent progress of vacuum techniques, a high degree of vacuum in the order of $10^{-10}$ Torr has come to be obtained without much difficulty by the use of an ion pump. Accordingly, some attempts have been made to use an electron gun of field emission type in a sample anaylsis apparatus using electron beam irradiation.

The sample to be irradiated by electron beam is also placed in vacuum. The degree of vacuum in the sample chamber need not be so high as that in the electron gun chamber but has only to be $10^{-5}$ Torr in practice. In an actual apparatus, however, the electron gun chamber and the sample chamber must communicate with each other through a small aperture through which the electron beam travels. Therefore, if the sample chamber is merely kept at vacuum in the order of $10^{-5}$ Torr, a flow of gas from the sample chamber to the electron chamber takes place. This prevents a stable field emission from being established. In order to solve this difficulty, the sample chamber should be preferably kept at vacuum in order of $10^{-7}$–$10^{-8}$ Torr.

As well known, the sample whose analysis has been completed must be replaced by another sample to be newly analysed. As methods of exchanging samples, there may be considered a method in which the sample chamber is separated from the electron gun chamber in vacuum continuum, the sample chamber is exposed to the atmosphere, a new sample is substituted for the old one, the sample chamber is evacuated up to $10^{-7}$–$10^{-8}$ Torr and the sample chamber and the electron gun chamber are brought into vacuum communication with each other (this method is hereafter referred to simply as the first method). However, this method has a drawback that the sample chamber must be evacuated up to a rather high degree of vacuum, thereby requiring a relatively long time for reevacuation.

There may be considered another method of exchanging samples, according to which a sample exchange chamber capable of being connected with and disconnected from the sample chamber in vacuum continuum is provided (this method is hereafter referred to simply as the second method). The sample exchange chamber has only to have a volume enough for sample exchange and usually has a smaller volume than the sample chamber. In the sample exchange operation, the sample is transferred from the sample chamber to the sample exchange chamber kept at vacuum in the order of $10^{-3}$–$10^{-5}$ Torr. The sample exchange chamber is then separated from the sample chamber and replenished with air. The old sample is replaced by a new one and the sample exchange chamber is again evacuated up to $10^{-3}$–$10^{-5}$ Torr. Then, the new sample is transferred from the sample exchange chamber to the sample chamber after the sample exchange chamber has been brought into vacuum communication with the sample chamber. According to this second method, such a problem as raised in the first method mentioned above can be solved, but there is still left a problem that a complicated and expensive mechanism to transfer the sample from the sample chamber to the sample exchange chamber or conversely in vacuum is needed. Moreover, when the detector to detect the information obtained from the sample is replaced by another detector in this second method, the vacuum condition of the sample chamber kept at $10^{-7}$–$10^{-8}$ Torr must be destroyed. This is the same problem as is caused in case of sample exchange in the first method.

SUMMARY OF THE INVENTION

One object of the present invention is to provide a sample analysis apparatus using electron beam irradiation, which is adapted for the case where there is a need that an electron gun chamber must be evacuated to a higher degree of vacuum than a sample chamber.

Another object of the present invention is to provide a sample analysis apparatus using electron beam irradiation, which can solve such problems as mentioned above.

According to the present invention, there is provided a sample analysis apparatus using electron beam irradiation, comprising: an electron gun chamber for housing an electron gun therein; a sample chamber for detachably housing therein a sample placed in position to be irradiated by the electron beam emitted from the electron gun; an intermediate chamber located between the electron gun chamber and the sample chamber to permit the sample to be irradiated by the electron beam, the intermediate chamber having a larger volume than the sample chamber; evacuation means for evacuating the electron gun chamber, the intermediate chamber and the sample chamber, the evacuation means evacuating the intermediate chamber to a degree of vacuum higher than the sample chamber and lower than the electron gun chamber; first valve means for connecting and disconnecting the electron gun chamber with and from the intermediate chamber in vacuum continuum; and second valve means for connecting and disconnecting the intermediate chamber with and from the sample chamber in vacuum continuum, wherein at least that portion of the sample chamber in which the sample is located is protuberant into the intermediate chamber.

With this apparatus, the sample chamber is made open to the atmosphere while the first and the second valve means are closed. Under this condition the exchange of samples is performed. After the completion of sample exchange, the sample chamber is evacuated and the second and then the first valve means are opened. In this case, since the degree of vacuum in the intermediate chamber is higher than that in the sample chamber, the degree of vacuum in the intermediate chamber is lowered when the second valve means is opened. However, since the volume of the sample chamber is smaller than that of the intermediate chamber, the degradation of the vacuum degree in the intermediate chamber is only momentary. After a certain transient time, the initial degree of vacuum is resumed in the intermediate chamber. The first valve means should be opened only after the second valve means has been opened, since the degree of vacuum in the electron gun chamber must be prevented from falling below an allowable limit due to the momentary degradation of vaccum degree in the intermediate chamber.

According to the first method mentioned above, the sample chamber must be kept at a relatively high degree of vacuum so as to prevent the flow of gas from the sample chamber into the electron gun chamber. On the other hand, according to the present invention, there is provided an intermediate chamber which need not be opened to the atmosphere for the exchange of samples, and if the degree of vacuum in the intermediate chamber is only kept equal to that in the sample chamber in the first method, the degree of vacuum in the sample chamber having a smaller volume than the intermediate chamber can be lower than that in the intermediate chamber so that the time required for evacuating the sample chamber after the exchange of samples from the atmospheric pressure up to a desired degree of vacuum will be shorter according to the present invention than according to the first method.

Moreover, according to the second method described above, there is provided for the exchange of samples a complicated and expensive mechanism which serves to transfer the samples from the sample chamber to the sample exchange chamber and conversely, but the apparatus according to the present invention needs no such mechanism.

Usually, the electron beam from the gun is focussed upon the sample by means of a convergence lens system. Since the angle $\alpha$ of convergence of the electron beam is very small, i.e. in the order of $10^{-2}$–$10^{-3}$ radian, the following relationship can be obtained: $\alpha = D/L$, where $D$ is the diameter of the electron beam at the convergence lens and $L$ is the distance between the lens and the sample. Here, it should be noted that the longer is the length of the intermediate chamber along the path of the electron beam, the greater is the distance $L$. If $\alpha$ is required to remain constant while $L$ is increased, $D$ must be correspondingly increased. The increase in $D$ causes the increase in the aberration of the convergence lens and therefore a degradation of the resolving power. In order to improve the resolving power, $D$ (i.e. $\alpha$) must be decreased, but the decrease in $D$ is accompanied by a decrease in brightness. Consequently, $L$ must not be made large.

In the apparatus according to the present invention, at least the portion of the sample chamber where the sample is actually located is protuberant into the intermediate chamber. If the partition wall between the intermediate chamber and the sample chamber is in the form of a plane, then the sample chamber as a whole must be disposed nearer to the electron gun chamber in order to decrease $L$. Accordingly, the intermediate chamber must take a shape which is short in the direction of travel of the electron beam. It is preferable that the volume of the intermediate chamber should be as great in comparison with that of the sample chamber as possible. This is essential for maintaining the function of the intermediate chamber to prevent the vacuum condition of the electron gun chamber from being adversely affected due to the degradation of the vacuum degree in the sample chamber, i.e. the function of the intermediate chamber to cut the direct communication of the sample chamber with the electron gun chamber. However, in order to make the volume of the intermediate chamber as large as possible while the length thereof along the path of the electron beam is kept short, the area of the cross section of the intermediate chamber perpendicular to the electron beam path must be made large enough. Accordingly, the shape of the apparatus as a whole is largely spoiled and moreover the insertion of a sample, the attachments of a mechanism for the fine adjustment of the sample and a means for detecting information from the sample etc. from outside to the sample chamber, the detachements of these members from the sample chamber to outside and the manipulation of the mechanism from outside, are considerably constrained.

In the apparatus according to the present invention, on the other hand, at least that portion of the sample chamber which contains the sample is protuberant into the intermediate chamber and in order to increase the volume of the intermediate chamber, the intermediate chamber except the portion occupied by the protuberant part of the sample chamber can be enlarged by extending the dimension of the chamber toward the sample chamber, without increasing the area of cross section perpendicular to the beam path. The most or entire part of the sample chamber may be enveloped by the intermediate chamber and in that case the above described merit can also be preserved.

DESCRIPTION OF THE PREFERRED EMBODIMENT

Figure 1:
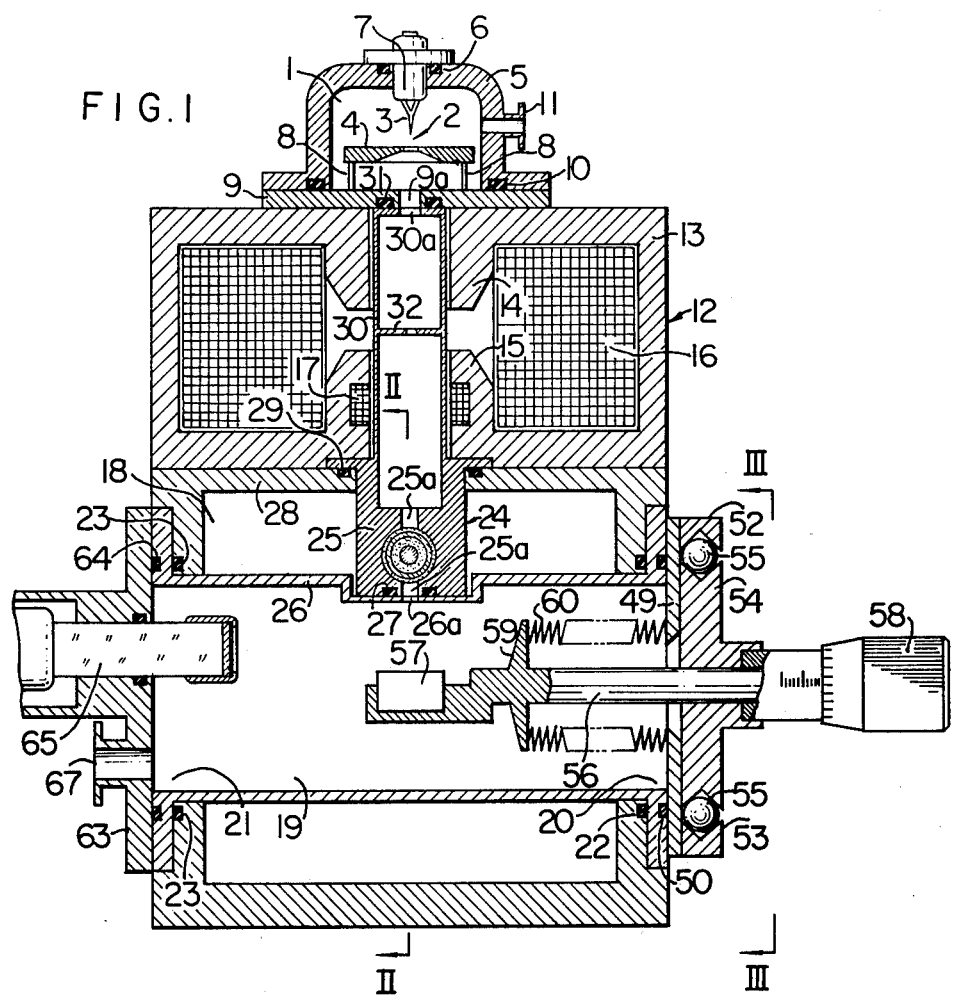
FIG. 1 shows in cross section a sample analysis apparatus using electron beam irradiation, as an embodiment of the present invention.
Figure 4:
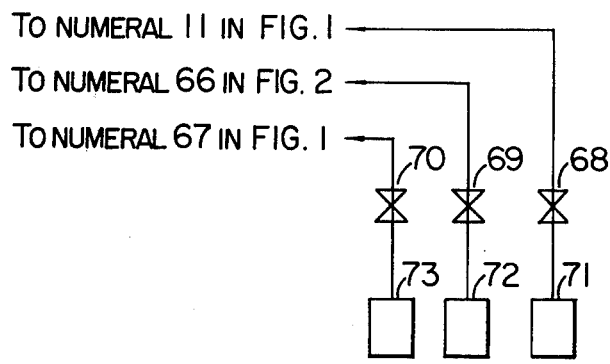
FIG. 4 is a block diagram of an evacuating system as an embodiment of the present invention, used in the apparatus shown in FIG. 1.

FIGS. 1 to 4 show a preferred embodiment of the present invention. In an electron gun chamber 1 is housed an electron gun 2 having a filament 3 of field emission type and an anode 4. The filament 3 is mounted on a filament support 7 which is an electrical insulator, attached via an air-tight gasket 6 to a cover 5 of the electron gun chamber 1 and the anode 4 is mounted by means of a plurality of anode support rods 8 on the base 9 of the chamber 1, having a beam aperture 9a. The cover 5 and the base 9 of the electron gun chamber 1 are coupled to each other by means of screws (not shown) with an air-tight gasket 10 interposed between them. An evacuating tube 11 is attached to the cover 5 and the base 9 is coupled by means of screws (not shown) to the upper surface of the yoke 13 of a convergence lens 12. The convergence lens 12 consists of the yoke 13 serving as magnetic core having an upper and a lower poles 14 and 15 and a field coil 16 for establishing between the poles 14 and 15 a magnetic field serving a magnetic lens. An electron beam deflection coil 17 is embedded in the lower pole 15 of the magnetic core (yoke) 13. The convergence lens 12 is attached by means of screws or through welding to the upper surface of an intermediate chamber 18. A sample chamber 19 in the shape of a hollow cylinder, having a smaller volume than the intermediate chamber is located in the intermediate chamber 18 and the ends 20 and 21 of the sample chamber 19 are attached to the wall 28 of the intermediate chamber by means of screws (not shown) with air-tight gaskets 22 and 23 interposed therebetween, in order that the sample chamber 19 may be opened outside the intermediate chamber 18. The lower portion of the valve body 25 of a valve mechanism 24 is coupled to the partition wall 26 between the chambers 18 and 19 near its beam aperture 26a, with an air-tight gasket 27 interposed therebetween. The upper portion of the valve body 25 passes through the wall 28 of the intermediate chamber 18 and is coupled to the wall 28 with an air-tight gasket 29 interposed therebetween. The upper portion of the valve body 25 is crowned with a thin-walled, integrally formed pipe 30. The pipe 30 has at its top a beam aperture 30a and is coupled to the base 9 of the electron gun chamber 1 with an air-tight gasket 31 interposed therebetween. An electron beam diaphragm 32 is provided at the middle portion of the pipe 30 near the magnetic lens. The valve body 25 has a beam aperture 25a and a conic bore 33 whose axis runs perpendicular to that of the beam aperture 25a and in which a conic valve counterpart is inserted. The valve unit 34 of the valve mechanism 24 has a first valve 35 in the shape of a truncated cone, which can be brought into close contact with the inner surface of the conic bore 33, and a second valve 36 which can be brought into close contact with the inner surface of the first valve 35. The first valve 35 has a communication aperture 37 through which the sample chamber 19 and the intermediate chamber 18 communicate with each other when the close contact between the second valve 36 and the inner surface of the first valve 35 is released while the first valve 35 is in close contact with the inner surface of the conic bore 33. The second valve 36 is fixed to a valve manipulation shaft 38 and the first valve 35 is slidably supported at a valve support 39 on the manipulation shaft in such a manner that the first valve 35 can move relative to the manipulation shaft 38 in the direction of the axis of the shaft 38. For the purpose of limiting the relative movement, a pin 40 is provided in the shaft 38 and a groove 41 is cut in the valve support 39, running along the shaft 38 to receive the pin 40 therein. The free end of the valve manipulation shaft 38 is extended out of the intermediate chamber 18 and in threaded engagement with a valve manipulation knob 42. The valve manipulation knob 42 is rotatably supported on a knob bearing 43, which is coupled by means of screws (not shown) to the wall 28 of the chamber 18, with an air-tight gasket 44 interposed therebetween. The valve manipulation shaft 38 has at its middle portion a cylindrical flange 46 and air-tight bellows 47 to allow the axial movement of the valve manipulation shaft 38 and to prevent the rotation of the shaft 38 are provided between the edge of the cylindrical flange 46 and the knob bearing 43. A compression spring 48 is provided between the bottom of the cylindrical flange 46 and the valve support. The ends 20 and 21 of the cylindrical sample chamber 19 are opened outside the intermediate chamber 18 and the base 49 of a sample stage is detachably coupled to the end 20 by means of screws 51, (FIG. 3) with an air-tight gasket 50 interposed therebetween. Guide members 52 and 53 for guiding the fine adjustment of the sample stage are fixed to the base 49 by means of screws (not shown) and a sample stage 54 for the fine adjustment of a sample is slidably engaged with the guide members 52 and 53 via steel balls 55. The steel balls are received in the V-shaped grooves cut in the guide members 52 and 53 and the sample stage 54, as shown in FIG. 1. A sample manipulation shaft 56 extends from outside the sample chamber 19 into the sample chamber 19, passing through the member 54 and the base 49, and carries at its end a sample 57. At the other end of the shaft 56 is provided a knob 58 for finely moving the shaft along its axis. The sample manipulation shaft 56 has a flange 59 and air-tight bellows 60 to allow the axial movement of the shaft 56 and to prevent the rotation of the shaft 56 are provided between the flanges 59 and the base 49. An adjustment screw 61 is in threaded engagement with the base 49 in such a manner that the end of the screw 61 is in contact with one side surface of the sample stage 54. A compression spring 62 is inserted between the base 49 and the opposite side surface of the member 54 in such a manner that the one side surface of the member 54 is always urged against the end of the adjustment screw 61. A detector mounting stage 63 is detachably coupled to the end 21 of the cylindrical sample chamber 19 by means of screws (not shown), with an air-tight gasket 64 interposed therebetween. A detector 65 of well known photomultiplying type, for detecting secondary electrons is mounted on the stage 63. The wall 28 of the intermediate chamber 18 and the detector mounting stage 63 have evacuating tubes 66 and 67, respectively. The evacuating tubes 11, 66 and 67 are connected respectively with vacuum pumps 71, 72 and 73 through valves 68, 69 and 70, as seen in FIG. 4.

Figure 2:
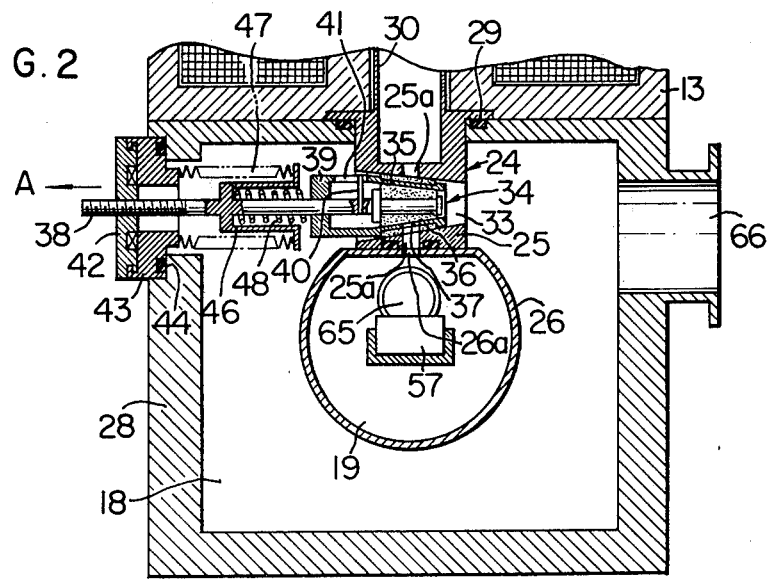
FIG. 2 is a cross section taken along line II—II in FIG. 1.
Figure 3:
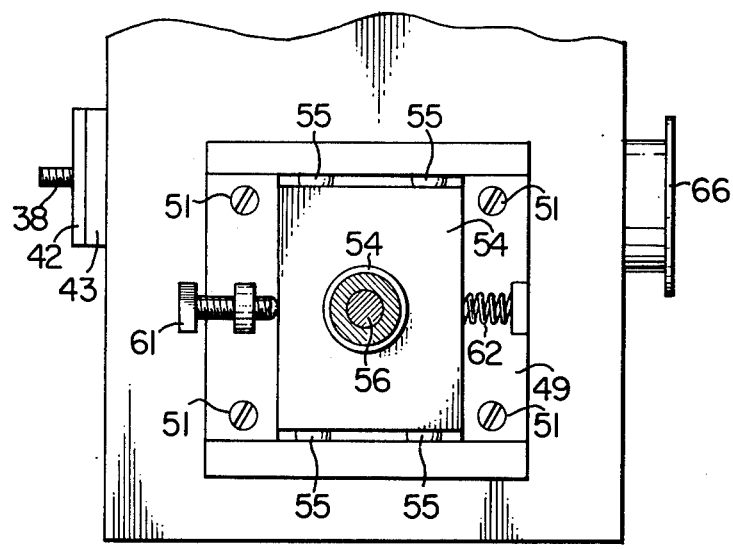
FIG. 3 is a cross section taken along line III—III in FIG. 1.

With this structure, when the valve manipulation knob 42 is rotated, the valve manipulation shaft 38 in threaded engagement with the knob 42 shifts in the direction indicated by the arrow A in FIG. 2 so that the second valve 36 fixed to the shaft 38 shifts in the same direction while the first valve remains in contact with surface 33 under bias from spring 48. If the knob 42 is further rotated, the pin 40 provided in the shaft 38 reaches the end of the groove 41 to initiate the movement of the first valve 35 in the direction of the arrow A. Accordingly, the electron gun chamber 1 communicates with the intermediate chamber 18 through the beam apertures 9a and 30a, the electron beam diaphragm 32, the beam aperture 25 and the conic bore 33; while the intermediate chamber 18 and the sample chamber 19 communicate with each other through the beam aperture 26a and 25a and the conic bore 33. Therefore, the electron gun chamber 1, the intermediate chamber 18 and the sample chamber communicate with one another.

Under this condition, it is assumed that the electron gun chamber 1, the intermediate chamber 18 and the sample chamber 19 have been evacuated respectively up to $10^{-10}$ Torr, $10^{-7}$–$10^{-8}$ Torr and $10^{-5}$ Torr, by the vacuum pumps 71, 72 and 73. When a highly intense field is established between the filament 3 and the anode 4, an electron beam is emitted from the filament 3 through field emission and accelerated through the anode 4. This beam travels through the beam apertures 9a and 30a, the electron beam diaphragm 32 and the beam apertures 25a and 26a, and is focussed on the sample by the convergence lens 12. The electron beam is also deflected in two-dimensional fashion by the deflection coil so the surface of the sample 57 is subjected to two-dimensional scanning with an electron beam. In this case, the information characteristic of the sample 57 in terms of secondary electrons, reflected electrons, X-rays, absorbed electrons or cathode luminescence is obtained from the sample 57 and, for example, the secondary electrons are detected by the detector 65 and converted to an electric signal. The electric signal is then introduced into a cathode ray tube (not shown) as a brilliance (or intensity) modulation signal according to the well known method. The two-dimensional deflection of the beams in the cathode ray tube by the associated deflection coil (not shown) is synchronized with the two-dimensional deflection of the electron beam by the deflection coil 17. Accordingly, the secondary electron image of the sample 57 is displayed on the screen of the cathode ray tube.

The choice of the positions of the irradiation of the sample 57, i.e. the choice of the observation field of the sample 57, can be easily performed by rotating the knob 58 and/or the adjustment screw 61. When the knob 58 is rotated, the sample is infinitesimally shifted in the direction perpendicular to the electron beam, i.e. in the axial direction of the sample manipulation shaft 56. When the adjustment screw 61 is rotated, the sample stage 54 is shifted in the direction perpendicular to both the electron beam and the axis of the shaft 56 so that the sample in infinitesimally transported in the same direction. Therefore, by appropriately operating the knob 58 and the screw 61, the sample can be infinitesimally shifted in a plane perpendicular to the electron beam, in any direction and by any distance.

In case of exchanging samples, the electron gun chamber 1, the intermediate chamber 18 and the sample chamber 19 are isolated from one another in vacuum continuum. This condition can be established by rotating the valve manipulation knob 42 in the reverse direction so that the first and the second valves 35 and 36 may be both closed, as shown in FIG. 2. The sample chamber 19 is now isolated from both the intermediate chamber 18 and the electron gun chamber 1. Then, the valve 70 is closed and the base 49 is detached from the end 20 of the sample chamber 19 by loosening the screws 51 so that the sample chamber 19 is made open to the atmosphere to replace the old sample by a new one. After the completion of the exchange of the samples, the base 49 is again attached onto the end 20 of the sample chamber 19 by driving the screws 51 into the end 20. Thereafter, the valve 70 is opened and the sample chamber 19 is evacuated by the pump 73. When the degree of vacuum in the sample chamber reaches the order of $10^{-3}$ Torr, the valve 70 is closed and the sample chamber 19 and the intermediate chamber 18 are caused to communicate with each other by rotating the valve manipulation knob 42 and therefore shifting the valve manipulating shaft 38 so that the close contact between the second valve 36 and the inner surface of the first valve 35 may be released. For, by doing this, the sample chamber 19 communicates with the intermediate chamber 18 through the beam apertures 26a and 25a, the communication aperture 37 and the conic bore 33. When the sample chamber 19 communicates with the intermediate chamber 18, the gas in the sample chamber 19 flows into the intermediate chamber 18 to lower the degree of vacuum in the intermediate chamber 18 in the order of $10^{-7}$–$10^{-8}$ Torr down to the order of $10^{-6}$ Torr. However, since the volume of the intermediate chamber 18 is much greater than that of the sample chamber 19, the degradation of the vacuum degree in the chamber 19 is only momentary. Accordingly, after the transient disturbance, the degrees of vacuum in the intermediate and sample chambers 18 and 19 settles to the orders of $10^{-7}$–$10^{-8}$ Torr and of $10^{-5}$ Torr, respectively. When the degrees of vacuum in the intermediate and sample chambers 18 and 19 reach the steady state, the electron gun chamber 1 and the intermediate chamber 18 are caused to communicate with each other. This is done by further rotating the valve manipulation knob 38 so that the first valve 35 along with the second valve 36 may be shifted in the direction indicated by the arrow A.

Ion pumps should be used as the pumps 71 and 72 since the electron gun chamber 1 and the intermediate chamber 18 must be evacuated up to relatively high degrees of vacuum. A rotary pump can be used as the pump 73 for evacuating the sample chamber 19 which is to be kept at a relatively low degree of vacuum.

The maintenance of the degrees of vacuum in the electron gun chamber 1, the intermediate chamber 18 and the sample chamber at such different values as mentioned above, is possible due to controlling the evacuation resistances of the passages connecting between the chambers 1 and 18 and between the chambers 18 and 19. The evacuation resistances should be varied depending on the size of the apparatus as a whole and the evacuation capacities of the used vacuum pumps 71 and 72. If the minimum diameter of each passage is chosen to be in a range of 0.1–6 mm in case of an apparatus whose acceleration voltage is not higher than 100 KV, the degrees of vacuum in the respective chambers can be kept at different values. Moreover, with such a structure, stable vacuum conditions can be reached in about 5–10 minutes even when the evacuation of the sample chamber is started at the atmospheric pressure.

The embodiment of the present invention shown in FIGS. 1 to 4 can enjoy the following advantages.

1. Since the high degrees of vacuum in both the electron gun chamber and the intermediate chamber can be maintained even during the operation of exchanging samples and since only the sample chamber whose volume is much smaller than that of the intermediate chamber and in which the degree of vacuum is lower than that in the intermediate chamber, is opened at the sample exchange operation, then the time required for the vacuum conditions in the apparatus to be stabilized can be shortened.

2. There is no need for a complicated and expensive mechanism for exchanging samples.

3. Since the most part of the sample chamber is within the intermediate chamber, the distance between the sample chamber and the electron gun chamber can be freely decreased without any structural disturbance by the intermediate chamber and the volume of the intermediate chamber can be increased without increasing the area of cross section of the intermediate chamber in the plane perpendicular to the electron beam.

4. In the case where the detector is detached from the sample chamber for cleaning or exchange, the time required for the vacuum conditions in apparatus to be stabilized after the remount or exchange of detector is equal to that in case of the exchange of a sample.

We claim:

1. A sample analysis apparatus using electron beam irradiation, comprising: an electron gun chamber for housing an electron gun therein which is capable of emitting an electron beam along a beam path; a sample chamber for detachably housing therein a sample placed in position along said beam path, to be irradiated by the electron beam emitted by said electron gun; an intermediate chamber substantially located between said electron gun chamber and said sample chamber along said beam path and including means to permit said electron beam to pass therethrough and into said sample chamber to said sample to be irradiated; said intermediate chamber having a larger volume than said sample chamber; evacuation means for evacuating said electron gun chamber, said intermediate chamber and said sample chamber; means for controlling said evacuation means to evacuate said intermediate chamber to a degree of vacuum higher than said sample chamber and lower than said electron gun chamber; first valve means for connecting and disconnecting said electron gun chamber with and from said intermediate chamber in vacuum continuum; and second valve means for connecting and disconnecting said intermediate chamber with and from said sample chamber in vacuum continuum; at least that portion of said sample chamber in which said sample is located projecting into said intermediate chamber so that a portion of said sample chamber is closer to said electron gun chamber than a portion of said intermediate chamber.

2. A sample anaylsis apparatus as claimed in claim 1, further including detector means disposed in said sample chamber for detecting an information characteristic of said sample obtained from said sample by detecting the irradiation of said sample with said electron beam, said sample chamber being in the shape of a hollow cylinder whose axis is substantially perpendicular to said electron beam path, disposed in said intermediate chamber with the ends thereof being capable of being opened to the outside of said intermediate chamber, said sample being disposed at one side of said sample chamber and said detector means being disposed at the other side of said sample chamber.

3. A sample analysis apparatus as claimed in claim 1, wherein said first and second valve means are so located that when they are actuated they may close and open the passages of said electron beam between said electron gun chamber and said intermediate chamber and between said intermediate chamber and said sample chamber.

4. A sample analysis apparatus as claimed in claim 3, wherein said first and second valve means are located in said intermediate chamber and extend between said electron gun chamber and said sample chamber.

5. A sample analysis apparatus as claimed in claim 4, further comprising means for infinitesimally shifting said sample in a plane substantially perpendicular to said electron beam path, said means being supported at said one end of said sample chamber.

6. A sample analysis apparatus as claimed in claim 2, wherein said information characteristic of said sample is obtained as a measure of secondary electrons by said detector means.

7. A sample analysis apparatus as claimed in claim 1, wherein said electron gun chamber includes an electron gun having a filament of the field emission type.

8. A sample anaylsis apparatus as claimed in claim 1, further including actuating control means connected to said first and second valve means for actuating said first and second valve means in sequence so that said second valve means will open prior to said first valve means.

9. A sample analysis apparatus as claimed in claim 1, wherein said first and second valve means are disposed in a valve body positioned between said electron gun chamber and said sample chamber, said valve body having a first bore in alignment with said electron beam path for allowing said electron beam to pass therethrough and a second transverse conical bore intersecting said first bore and carrying said first and second valve means.

10. A sample analysis apparatus as claimed in claim 9, further including actuating control means connected to said first and second valve means for actuating said first and second valve means in sequence so that said second valve means will open prior to said first valve means.

11. A sample analysis apparatus as claimed in claim 6, wherein said first valve means comprises a hollow first truncated cone positioned to be brought into close contact with the inner surface of said second conical bore and having a passage in the wall thereof which is in alignment with that portion of said first bore extending toward said sample chamber when said first cone is in contact with said second conical bore.

12. A sample analysis apparatus as claimed in claim 6, wherein said second valve means comprises a second truncated cone disposed within the hollow of said first truncated cone to selectively seal said passage therein.

13. A sample analysis apparatus as claimed in claim 8, wherein said actuating control means comprises a piston connected to said second truncated cone and extending outside said intermediate chamber to permit selective axial movement of said second truncated cone into and out of contact with said first truncated cone, and means linking said piston to said first truncated cone to effect movement of said first truncated cone by said piston while biasing said first truncated cone out of contact with said second truncated cone.

14. A sample analysis apparatus as claimed in claim 1, wherein said sample chamber is provided in the form of a hollow cylinder disposed within said intermediate chamber and whose axis is substantially perpendicular to said electron beam path.

15. A sample analysis apparatus as claimed in claim 14, wherein said sample chamber extends entirely through said intermediate chamber and has its ends closed by respective first and second covers.

16. A sample analysis apparatus as claimed in claim 15, wherein said first and second valve means are disposed in a valve body positioned between said electron gun chamber and said sample chamber, said valve body having a first bore in alignment with said electron beam path for allowing said electron beam to pass therethrough and a second transverse conical bore intersecting said first bore and carrying said first and second valve means.

* * * * *